(12) United States Patent
Tian et al.

(10) Patent No.: US 12,031,436 B1
(45) Date of Patent: Jul. 9, 2024

(54) REAL-TIME MONITORING SYSTEM AND METHOD FOR COAL MINE ROOF FRACTURES DURING ROADWAY TUNNELING PROCESS

(71) Applicant: Henan Polytechnic University, Jiaozuo (CN)

(72) Inventors: Lin Tian, Jiaozuo (CN); Mingyue Sun, Jiaozuo (CN); Xiaowei Zhuang, Jiaozuo (CN); Shengliang Lu, Jiaozuo (CN); Jinghao Wu, Jiaozuo (CN); Zhaoxu Wu, Jiaozuo (CN)

(73) Assignee: HENAN POLYTECHNIC UNIVERSITY, Henan (CN)

( * ) Notice: Subject to any disclaimer, the term of this patent is extended or adjusted under 35 U.S.C. 154(b) by 0 days.

(21) Appl. No.: 18/413,135

(22) Filed: Jan. 16, 2024

Related U.S. Application Data

(63) Continuation of application No. PCT/CN2023/136291, filed on Dec. 5, 2023.

(30) Foreign Application Priority Data

Jan. 17, 2023 (CN) .......................... 202310056008.9

(51) Int. Cl.
*E21D 9/00* (2006.01)
*E21C 39/00* (2006.01)
*G06F 30/13* (2020.01)

(52) U.S. Cl.
CPC .............. *E21D 9/003* (2013.01); *E21C 39/00* (2013.01); *G06F 30/13* (2020.01); *E21C 2100/00* (2023.05)

(58) Field of Classification Search
CPC .... E21C 2100/00; E21C 39/00; E21F 17/185; E21F 17/18; E21D 9/003
See application file for complete search history.

(56) References Cited

U.S. PATENT DOCUMENTS

2022/0112806 A1    4/2022  Luo

FOREIGN PATENT DOCUMENTS

| CN | 102944906 | 2/2013 |
| CN | 104373154 | 2/2015 |

(Continued)

OTHER PUBLICATIONS

CN-116593051-A Translation (Year: 2023).*

(Continued)

*Primary Examiner* — Schyler S Sanks
(74) *Attorney, Agent, or Firm* — Pilloff Passino & Cosenza LLP; Rachel K. Pilloff; Sean A. Passino

(57) ABSTRACT

The disclosure provides a real-time monitoring system and a real-time monitoring method for coal mine roof fractures during a roadway tunneling process, where the monitoring system includes a roadway model building module for building a three-dimensional model of a roadway; a roof monitoring module for obtaining roof fracture development data in real time; a fracture analysis module for obtaining a development pattern of roof fractures according to the three-dimensional model of the roadway and the roof fracture development data; a fracture formation prediction module for judging a fracture formation time according to the development pattern of the roof fractures; and an early warning processing module for early warning according to the fracture formation time.

2 Claims, 2 Drawing Sheets

(56) References Cited

FOREIGN PATENT DOCUMENTS

| CN | 105093349 | | | 11/2015 |
| CN | 106246222 | | | 12/2016 |
| CN | 109117589 | | | 1/2019 |
| CN | 110593875 | | | 12/2019 |
| CN | 111271129 | | | 6/2020 |
| CN | 111914456 | | | 11/2020 |
| CN | 12096382 | | | 12/2020 |
| CN | 113821917 | A | * | 12/2021 |
| CN | 116050277 | A | * | 5/2023 |
| CN | 116090351 | A | * | 5/2023 |
| CN | 116593051 | A | * | 8/2023 |
| JP | 2000097737 | | | 4/2000 |
| JP | 2019214930 | | | 12/2019 |
| SU | 1154467 | | | 5/1985 |
| WO | 2015069817 | | | 5/2015 |

OTHER PUBLICATIONS

CN-116090351-A Translation (Year: 2023).*
CN-116050277-A Translation (Year: 2023).*
CN-113821917-A Translation (Year: 2021).*
Notification to Grant Patent Right for Invention from SIPO in 202310056008.9 dated Aug. 31, 2023.
Search report from SIPO in 202310056008.9 dated Jul. 21, 2023.
Office action from SIPO in 202310056008.9 dated Jul. 29, 2023.
Search report from SIPO in 202310056008.9 dated Aug. 23, 2023.
Xu Jianku, et al., Real-time Monitoring and Early Warning Roadway Deformation Based on Machine Vision, Engineering Science and Technology I Series, No. 10. Oct. 15, 2012 (English Abstract pp. II-VI).
Qiang Ren, et al., Numerical simulation analysis of overburden crack belt developing disciplinary, Journal of Safety and Environment, vol. 6, Jul. 31, 2006 (English language abstract on last page).

* cited by examiner

REAL-TIME MONITORING SYSTEM AND METHOD FOR COAL MINE ROOF FRACTURES DURING ROADWAY TUNNELING PROCESS

CROSS-REFERENCE TO RELATED APPLICATIONS

This application is a continuation of PCT/CN2023/136291, filed on Dec. 5, 2023, and claims priority of Chinese Patent Application No. 202310056008.9, filed on Jan. 17, 2023, the entire contents of which are incorporated herein by reference.

TECHNICAL FIELD

The disclosure belongs to a field of coal mine roof monitoring, and in particular to a real-time monitoring system and a real-time monitoring method for coal mine roof fractures during a roadway tunneling process.

BACKGROUND

With the continuous advancement of coal mine roadway, primary fractures and regenerative fractures in the roadway surrounding rock continue to develop, which may form larger broken zones and abscission zones, and even cause major accidents such as large-scale roof collapse and roof seepage. Therefore, it is of great significance to monitor and study the development of roof fractures for studying the roadway roof strata location, detecting the roadway support effect, optimizing the roadway support scheme and support parameters, and predicting the roof accidents.

In the prior art, methods for monitoring coal mine roof fractures mainly include a drilling core method, an ultrasonic imaging method, a flow logging method, a drilling peep method and a deep displacement monitoring method. Among them, the drilling core method is drilling and coring the rock mass, reflecting rock mass destruction and rock composition in the surrounding rock to a certain extent, however, since a continuous observation is not possible, the detection results are incapable of reflecting a dynamic change process of fracture development in rock stratum. The ultrasonic imaging method is capable of providing a large number of effective and visible quantitative data of drilled rock mass, but is greatly influenced by drilling conditions such as pore size and mud viscosity, and has a more complicated observation process and higher cost. The flow logging method is mainly used to determine geological conditions such as location, thickness, number of layers and layered flow of aquifers, and is incapable of effectively identifying the formation of fractures.

SUMMARY

The present disclosure provides a real-time monitoring system and a real-time monitoring method for coal mine roof fractures during a roadway tunneling process, so as to solve the problems existing in the prior art.

On the one hand, in order to achieve the above objectives, the disclosure provides the real-time monitoring system for the coal mine roof fractures during the roadway tunneling process, including a roadway model building module, a roof monitoring module, a fracture analysis module, a fracture formation prediction module and an early warning processing module;

where the roadway model building module is used for building a three-dimensional model of a roadway;

the roof monitoring module is used for obtaining roof fracture development data in real time;

the fracture analysis module is used for obtaining a development pattern of roof fractures according to the three-dimensional model of the roadway and the roof fracture development data;

the fracture formation prediction module is used for judging a fracture formation time according to the development pattern of the roof fractures; and the early warning processing module is used for early warning according to the fracture formation time.

Optionally, the roadway model building module adopts a 3D modeling software, and obtains engineering data such as roadway rock stratum distribution, roadway section parameters, tunneling speed, and builds the three-dimensional model of the roadway according to the engineering data.

Optionally, the roof fracture development data includes roof stress, roof pressure and roof displacement data; the roof monitoring module includes a plurality of stress sensors, pressure sensors and displacement sensors arranged at different depths of the roof.

Optionally, the fracture analysis module obtains a roof inclination angle and a connectivity of the roadway according to the three-dimensional model of the roadway, and obtains a current shape of the roof according to the roof inclination angle and the connectivity; obtains a roof stress condition according to stress and pressure in the roof fracture development data, obtains a shape change of the roof according to the roof displacement data, obtains a change trend of the roof inclination angle and the connectivity according to the roof stress condition and the shape change, and obtains the development pattern of the roof fractures according to the current shape and the change trend.

Optionally, the fracture formation prediction module obtains a formation time and a horizontal location of a single fracture according to the development pattern of the roof fractures, and generates a second-level early warning instruction according to the formation time to send to the early warning processing module; when there are fractures in a same horizontal location, the fracture formation prediction module judges a formation time of a through fracture according to a formation time of the fractures in the same location, and generates a first-level early warning instruction according to the formation time of the through fracture to send to the early warning processing module.

On the other hand, in order to achieve the above objectives, the disclosure also provides the real-time monitoring method for the coal mine roof fractures during the roadway tunneling process, including following steps:

building a three-dimensional model of a roadway, and obtaining roof fracture development data;

obtaining a development pattern of roof fractures based on the three-dimensional model of the roadway and the roof fracture development data;

judging a formation time of a single fracture and a formation time of a through fracture based on the development pattern of the roof fractures; and carrying out early warning based on the formation time of the single fracture and the formation time of the through fracture respectively.

Optionally, a process of building the three-dimensional model of the roadway includes:
obtaining a roadway rock stratum distribution and roadway engineering parameters; and
using a 3D modeling software, building the three-dimensional model of the roadway based on the rock stratum distribution and the roadway engineering parameters.

Optionally, the roof fracture development data includes roof stress, roof pressure and roof displacement data, and the roof stress, the roof pressure and the roof displacement data are respectively obtained based on stress sensors, pressure sensors and displacement sensors; sensor locations are determined by a roadway height, and each group of sensors is respectively arranged at locations of 0.5 time, 1 time, 2 times, 3 times and 5 times of the roadway height.

Optionally, a process of obtaining the fracture development law based on the three-dimensional model of the roadway and the roof fracture development data includes:
obtaining a roof inclination angle and a connectivity of the roadway based on the three-dimensional model of the roadway;
obtaining a current shape of the roof based on the roof inclination angle and the connectivity;
obtaining a roof stress condition based on stress and pressure in the roof fracture development data, and obtaining a shape change of the roof based on the roof displacement data;
obtaining a change trend of the roof inclination angle and the connectivity based on the roof stress condition and the shape change; and
obtaining the development pattern of the roof fractures based on the current shape and the change trend.

Optionally, a process of judging the formation time of the single fracture and the formation time of the through fracture based on the development pattern of the roof fractures includes:
obtaining the formation time and a horizontal location of the single fracture based on the development pattern of the roof fractures; and
judging whether there are fractures in a same horizontal location based on the horizontal location of the single fracture, and if there are fractures in the same horizontal location, obtaining the formation time of the through fracture based on a formation time of the fractures in the same horizontal location.

The disclosure has following technical effects.

The disclosure realizes a real-time simulation analysis of the shape change of the roof and the fracture development process by building the three-dimensional model of the roadway and obtaining multi-source data, predicts the formation time of the single fracture through the fracture development law, and completes a formation prediction of the through fracture at the same time.

BRIEF DESCRIPTION OF THE DRAWINGS

The accompanying drawings, constituting a part of the disclosure, are used to provide a further understanding of the disclosure. The illustrative embodiments of the disclosure and the descriptions thereof are used to explain the disclosure, and do not constitute an improper limitation of the disclosure. In the attached drawings.

DETAILED DESCRIPTION OF THE EMBODIMENTS

It should be noted that the embodiments in the disclosure and the features in the embodiments may be combined with each other without conflict. The present disclosure is described in detail with reference to the attached drawings and embodiments.

It should also be noted that the steps shown in the process of the accompanying drawings may be executed in a computer system such as a set of computer-executable instructions, and although the logical order is shown in the process, in some cases, the steps shown or described may be executed in a different order from here.

Embodiment 1

Figure 1:
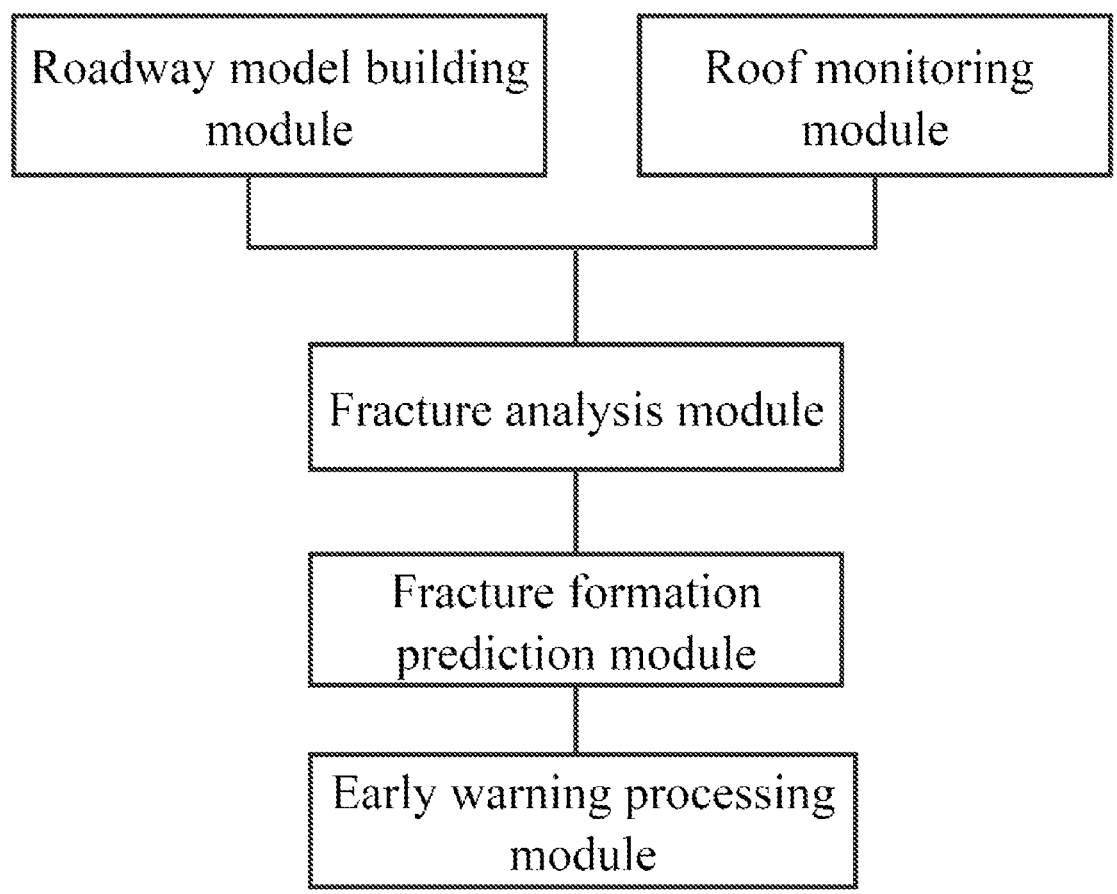
FIG. 1 is a schematic structural diagram of a real-time monitoring system for coal mine roof fractures during a roadway tunneling process in an embodiment of the present disclosure.

As shown in FIG. 1, this embodiment provides a real-time monitoring system for coal mine roof fractures during a roadway tunneling process, including a roadway model building module, a roof monitoring module, a fracture analysis module, a fracture formation prediction module and an early warning processing module; specifically, the roadway model building module obtains a roadway rock stratum distribution and a roadway construction report, generates the three-dimensional model of the roadway by using FLAC (Fast Lagrangian Analysis of Continua) 3D, and obtains an inclined state and a connected state of each roof in the roadway by observing the three-dimensional model of the roadway.

The roof monitoring module includes a plurality of stress sensors, pressure sensors and displacement sensors arranged in the roadway; sensor locations are determined by a roadway height; each group of sensors is respectively arranged at locations of 0.5 times, 1 time, 2 times, 3 times and 5 times of the roadway height, and is used for obtaining pressure and stress conditions and roof displacement data, which representing the stress state and displacement of the roof.

After the model construction and data collection are completed, the fracture analysis module obtains a roof inclination angle and a connectivity of the roadway through the three-dimensional model of the roadway, and represents the current shape of the roadway roof according to the inclination angle and the connectivity. At the same time, the current stress condition of the roof is obtained according to stress and pressure in the sensor data, and the shape changes of the roof are obtained through the displacement data. Then, according to the current stress situation of the roof and the shape change of the roof, the change trend of the roof inclination angle and the connectivity is obtained, and finally, the development pattern of the roof fractures is obtained through the current shape and the change trend of the roof.

After obtaining the development pattern of the roof fractures, the fracture formation prediction module simulates according to the development pattern of the roof fractures, and sets thresholds for changes of the inclination angle and the connectivity according to formation conditions of fractures. When the inclination angle is greater than the set inclination angle threshold, or the connectivity of the roof is less than the set inclination angle threshold, the corresponding time exceeding the threshold is obtained and judged as a formation time of a single fracture. At this time, a second-level early warning instruction is generated according to the formation time of a single fracture and sent to the early warning processing module.

The location where a single fracture is formed may be accurately obtained through the three-dimensional model of the roadway. Roadway strata generally have a multi-layer rock structure, and each rock stratum at different horizontal locations may form fractures. When different rock strata form fractures at the same location, a through fracture forms, thus seriously endangering the safety of the roadway. Therefore, it is necessary to identify the through fracture. At this time, the fracture formation prediction module judges whether fractures with the same horizontal location are about to form by obtaining the location of each fracture. When it is judged that fractures with the same location exist, the fracture formation prediction module obtains the formation time of the fractures. When the formation time of two or more fractures is close, it means that a through fracture is about to appear at this location. At this time, the early warning is carried out according to the fractures with similar formation time, and a first-level early warning instruction is generated and sent to the early warning processing module.

Finally, the early warning processing module prompts the staff according to the second-level early warning instruction and the first-level early warning instruction. For the second-level early warning instruction, a relatively mild early warning may be carried out, such as marking the location of the single fracture and displaying the formation time, and for the first-level early warning instruction, an emergency early warning may be carried out, and the staff may be prompted by an audio alarm. The specific early warning form may be adjusted according to the actually selected alarm device.

Embodiment 2

Figure 2:
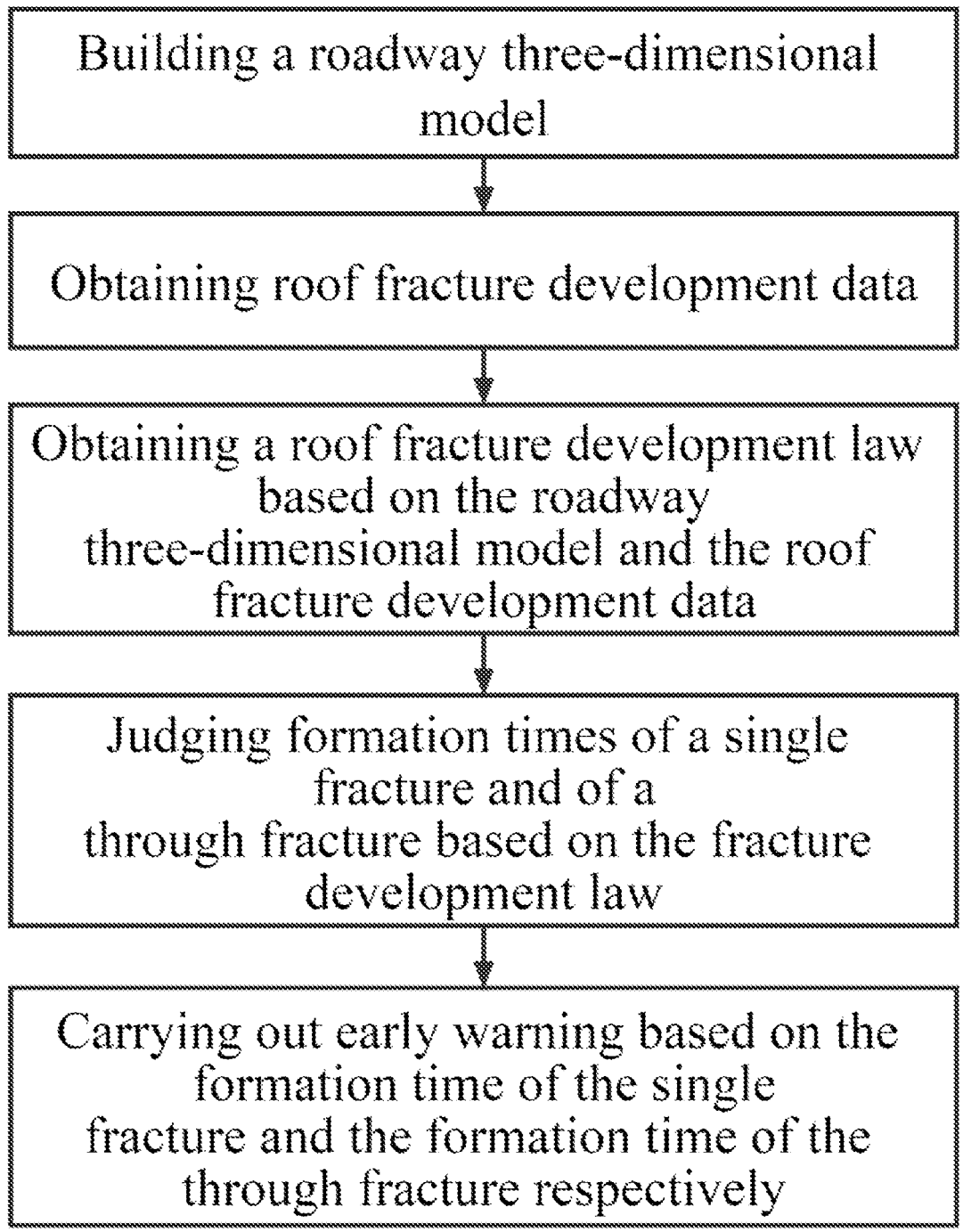
FIG. 2 illustrates a process of a real-time monitoring method for coal mine roof fractures during a roadway tunneling process in an embodiment of the present disclosure.

As shown in FIG. 2, this embodiment provides a real-time monitoring method for coal mine roof fractures during a roadway tunneling process, includes following steps:
building a three-dimensional model of a roadway, and obtaining roof fracture development data;
obtaining a development pattern of roof fractures based on the three-dimensional model of the roadway and the roof fracture development data;
judging a formation time of a single fracture and a formation time of a through fracture based on the development pattern of the roof fractures; and
carrying out early warning based on the formation time of the single fracture and the formation time of the through fracture respectively.

As an optional implementation of the disclosure, a process of building the three-dimensional model of the roadway includes:
obtaining a roadway rock stratum distribution and roadway engineering parameters; and
using a 3D modeling software, building the three-dimensional model of the roadway based on the rock stratum distribution and the roadway engineering parameters.

As an optional implementation of the disclosure, the roof fracture development data includes roof stress, roof pressure and roof displacement data, and the roof stress, the roof pressure and the roof displacement data are respectively obtained based on stress sensors, pressure sensors and displacement sensors; sensor locations are determined by a roadway height, and each group of sensors is respectively arranged at locations of 0.5 times, 1 time, 2 times, 3 times and 5 times of the roadway height.

As an optional implementation of the disclosure, a process of obtaining the fracture development law based on the three-dimensional model of the roadway and the roof fracture development data includes:
obtaining a roof inclination angle and a connectivity of the roadway based on the three-dimensional model of the roadway;
obtaining a current shape of the roof based on the roof inclination angle and the connectivity;
obtaining a roof stress condition based on stress and pressure in the roof fracture development data, and obtaining a shape change of the roof based on the roof displacement data;
obtaining a change trend of the roof inclination angle and the connectivity based on the roof stress condition and the shape change; and
obtaining the development pattern of roof fractures based on the current shape and the change trend.

As an optional implementation of the disclosure, a process of judging the formation time of the single fracture and the formation time of the through fracture based on the development pattern of the roof fractures includes:
obtaining the formation time and a horizontal location of the single fracture based on the development pattern of the roof fractures; and
judging whether there are fractures in a same horizontal location based on the horizontal location of the single fracture, and if there are fractures in the same horizontal location, obtaining the formation time of the through fracture based on a formation time of the fractures in the same horizontal location.

Each embodiment in this specification is described in a progressive way, and each embodiment focuses on the differences from other embodiments, so it is only necessary to refer to the same and similar parts between each embodiment. As for the method disclosed in the embodiment, because it corresponds to the system disclosed in the embodiment, the description is relatively simple, and the relevant points can only be found in the description of the system.

The above is only the preferred embodiment of this disclosure, but the protection scope of this disclosure is not limited to this. Any change or replacement that may be easily thought of by a person familiar with the technical field within the technical scope disclosed in this disclosure should be covered by this disclosure. Therefore, the protection scope of this disclosure should be based on the protection scope of the claims.

What is claimed is:

1. A real-time monitoring system for coal mine roof fractures during a roadway tunneling process, comprising a roadway model building module, a roof monitoring module, a fracture analysis module, a fracture formation prediction module and an early warning processing module;
the roadway model building module is configured for building a three-dimensional model of a roadway;
the roof monitoring module is configured for obtaining roof fracture development data in real time;
the fracture analysis module is configured for obtaining a development pattern of roof fractures according to the three-dimensional model of the roadway and the roof fracture development data;
the fracture formation prediction module is configured for judging a fracture formation time according to the development pattern of the roof fractures; and
the early warning processing module is configured for early warning according to the fracture formation time;

the roadway model building module using a 3D modeling software, and obtains engineering data including roadway rock stratum distribution, roadway section parameters, tunneling speed, and builds the three-dimensional model of the roadway according to the engineering data;

the roof fracture development data comprises roof stress, roof pressure and roof displacement data; the roof monitoring module comprises a plurality of stress sensors, pressure sensors and displacement sensors arranged at different depths of the roof;

the fracture analysis module obtains a roof inclination angle and a connectivity of the roadway according to the three-dimensional model of the roadway, obtains a current shape of the roof according to the roof inclination angle and the connectivity, obtains the roof stress and the roof pressure within the roof fracture development data, obtains a shape change of the roof according to the roof displacement data, obtains a change trend of the roof inclination angle and the connectivity according to the roof stress condition and the shape change, and obtains the development pattern of the roof fractures according to the current shape and the change trend;

the fracture formation prediction module obtains a formation time and a horizontal location of a single fracture according to the development pattern of the roof fractures, and generates a second-level early warning instruction according to the formation time to send to the early warning processing module; when there are fractures in a same horizontal location, the fracture formation prediction module judges a formation time of a through fracture according to a formation time of the fractures in the same location, and generates a first-level early warning instruction according to the formation time of the through fracture to send to the early warning processing module.

2. A real-time monitoring method for coal mine roof fractures during a roadway tunneling process, comprising following steps:

building a three-dimensional model of a roadway, and obtaining roof fracture development data;

obtaining a development pattern of roof fractures based on the three-dimensional model of the roadway and the roof fracture development data;

judging a formation time of a single fracture and a formation time of a through fracture based on the development pattern of the roof fractures; and carrying out early warning based on the formation time of the single fracture and the formation time of the through fracture respectively;

a process of building the three-dimensional model of the roadway comprises:

obtaining a roadway rock stratum distribution and roadway engineering parameters; and using a 3D modeling software, building the three-dimensional model of the roadway based on the rock stratum distribution and the roadway engineering parameters;

the roof fracture development data comprises roof stress, roof pressure and roof displacement data, and the roof stress, the roof pressure and the roof displacement data are respectively obtained based on stress sensors, pressure sensors and displacement sensors; sensor locations are determined by a roadway height;

a process of obtaining a fracture development law based on the three-dimensional model of the roadway and the roof fracture development data comprises:

obtaining a roof inclination angle and a connectivity of the roadway based on the three-dimensional model of the roadway;

obtaining a current shape of a roof based on the roof inclination angle and the connectivity;

obtaining the roof stress and the roof pressure within the roof fracture development data, and obtaining a shape change of the roof based on the roof displacement data;

obtaining a change trend of the roof inclination angle and the connectivity based on the roof stress condition and the shape change; and obtaining the development pattern of the roof fractures based on the current shape and the change trend;

a process of judging the formation time of the single fracture and the formation time of the through fracture based on the development pattern of the roof fractures comprises:

obtaining the formation time and a horizontal location of the single fracture based on the development pattern of the roof fractures; and judging whether there are fractures in a same horizontal location based on the horizontal location of the single fracture, and if there are fractures in the same horizontal location, obtaining the formation time of the through fracture based on a formation time of the fractures in the same horizontal location.

* * * * *